United States Patent
Aranovsky

(10) Patent No.: US 7,737,727 B2
(45) Date of Patent: Jun. 15, 2010

(54) BI-DIRECTIONAL BUFFER FOR OPEN-DRAIN OR OPEN-COLLECTOR BUS

(75) Inventor: Anatoly Aranovsky, Los Gatos, CA (US)

(73) Assignee: Intersil Americas Inc., Milpitas, CA (US)

( * ) Notice: Subject to any disclaimer, the term of this patent is extended or adjusted under 35 U.S.C. 154(b) by 0 days.

(21) Appl. No.: 12/060,829

(22) Filed: Apr. 1, 2008

(65) Prior Publication Data

US 2009/0153192 A1 Jun. 18, 2009

Related U.S. Application Data

(60) Provisional application No. 61/014,356, filed on Dec. 17, 2007, provisional application No. 61/024,476, filed on Jan. 29, 2008.

(51) Int. Cl.
H03K 19/0175 (2006.01)

(52) U.S. Cl. .............................. 326/83; 326/82; 326/86; 326/90

(58) Field of Classification Search .................... 326/86, 326/112, 115, 127, 82, 83, 90
See application file for complete search history.

(56) References Cited

U.S. PATENT DOCUMENTS

| | | |
|---|---|---|
| 4,695,740 A | 9/1987 | Carter |
| 4,713,557 A | 12/1987 | Carter |
| 4,835,418 A | 5/1989 | Hsieh |
| 4,982,115 A | 1/1991 | Lee |
| 5,079,693 A | 1/1992 | Miller |
| 5,107,148 A | 4/1992 | Millman |
| 5,107,507 A | 4/1992 | Bland et al. |
| 5,132,987 A | 7/1992 | Motohashi et al. |
| 5,173,619 A | 12/1992 | Gaudenzi et al. |
| 5,214,330 A | 5/1993 | Okazaki et al. |
| 5,214,638 A | 5/1993 | Norz et al. |
| 5,248,908 A | 9/1993 | Kimura |
| 5,295,246 A | 3/1994 | Bischoff et al. |
| 5,300,835 A | 4/1994 | Assar et al. |
| 5,381,062 A | 1/1995 | Morris |
| 5,418,933 A | 5/1995 | Kimura et al. |
| 5,428,649 A | 6/1995 | Cecchi |
| 5,428,800 A | 6/1995 | Hsieh et al. |
| 5,517,135 A | 5/1996 | Young |
| 5,627,480 A | 5/1997 | Young et al. |
| 5,644,729 A | 7/1997 | Amini et al. |
| 5,715,405 A | 2/1998 | McClear et al. |

(Continued)

OTHER PUBLICATIONS

"LTC4300-A1/LTC4300A-2:Hot Swappable 2-Wire Bus Buffers," © Linear Technology Corporation, Milpitas, California (2001).

Primary Examiner—Vibol Tan
(74) Attorney, Agent, or Firm—Fliesler Meyer LLP

(57) ABSTRACT

Provided herein are bi-directional buffers, and methods for providing bi-directional buffering. In an embodiment, a bi-directional buffer includes a differential input/differential output amplifier that includes a first input/output node and a second/input output node. The differential input/differential output amplifier is configurable in a first configuration and a second configuration. When in the first configuration, the second input/output node follows the first input/output node. When in the second configuration, the first input/output node follows the second input/output node.

27 Claims, 7 Drawing Sheets

U.S. PATENT DOCUMENTS

| | | | |
|---|---|---|---|
| 5,736,870 A | 4/1998 | Greason et al. | |
| 5,790,526 A * | 8/1998 | Kniess et al. | 370/257 |
| 5,808,492 A | 9/1998 | Chow | |
| 5,859,545 A * | 1/1999 | Thornblad | 326/90 |
| 5,917,348 A | 6/1999 | Chow | |
| 5,923,187 A | 7/1999 | Maugars | |
| 6,046,605 A | 4/2000 | Ziemkowski et al. | |
| 6,060,906 A | 5/2000 | Chow et al. | |
| 6,075,384 A | 6/2000 | Sim et al. | |
| 6,275,066 B1 | 8/2001 | Park et al. | |
| 6,513,090 B1 | 1/2003 | Jeddeloh | |
| 6,650,174 B2 | 11/2003 | Bell | |
| 6,822,480 B1 * | 11/2004 | McCalmont | 326/81 |
| 6,834,318 B2 | 12/2004 | Hunter et al. | |
| 6,842,806 B2 * | 1/2005 | Ervin | 710/110 |
| 6,857,040 B2 * | 2/2005 | Noonan et al. | 710/306 |
| 7,032,051 B2 | 4/2006 | Reay | |
| 7,061,274 B2 | 6/2006 | George | |
| 7,205,793 B2 | 4/2007 | George | |
| 7,218,149 B2 | 5/2007 | Arai | |
| 7,292,067 B2 | 11/2007 | Schwarz | |
| 7,321,241 B1 | 1/2008 | Marak et al. | |
| 7,348,803 B2 | 3/2008 | Bui et al. | |
| 2005/0146358 A1 * | 7/2005 | Barus et al. | 326/86 |
| 2006/0038587 A1 * | 2/2006 | Barus et al. | 326/86 |
| 2006/0075170 A1 * | 4/2006 | Behrendt et al. | 710/110 |

* cited by examiner

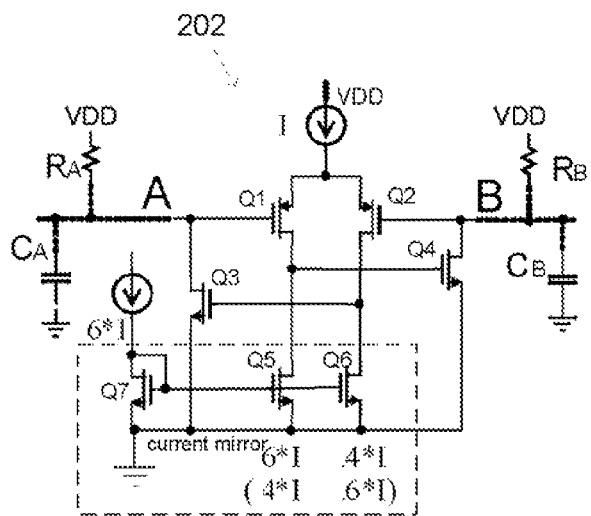
Fig. 2c
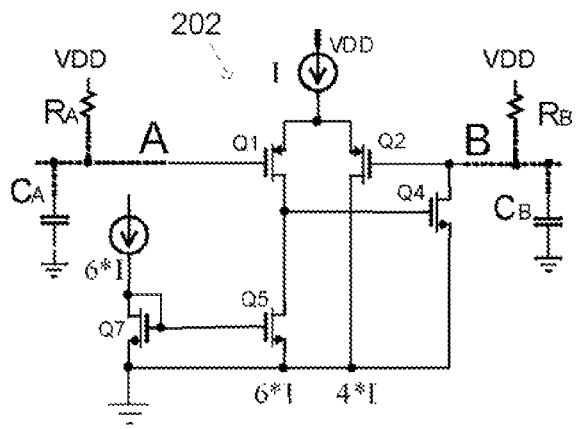
Fig. 3 (configuration that causes node B to follow node A)
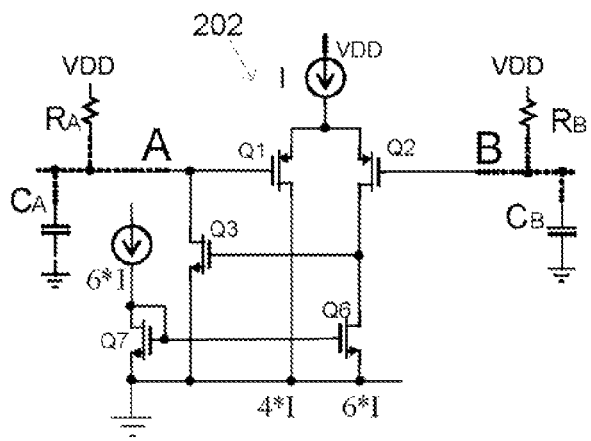
Fig 4 (configuration that causes node A to follow node B)

BI-DIRECTIONAL BUFFER FOR OPEN-DRAIN OR OPEN-COLLECTOR BUS

PRIORITY CLAIM

This application claims priority under 35 U.S.C. 119(e) to U.S. Provisional Patent Application No. 61/014,356, filed Dec. 17, 2007, and U.S. Provisional Patent Application No. 61/024,476, filed Jan. 29, 2008, both of which are incorporated herein by reference.

BACKGROUND

An open drain bus, such as an Inter-Integrated Circuit (I2C) bus, a System Management Bus (SMBus), and others, usually includes a data line and a clock line. Such a data line and a clock line can each be referred to individually as a bus line, or simply as a line. As shown in FIG. 1a, each bus line (e.g., 101) is connected to a pull-up resistor R, pull down transistors Q1, Q2 and Q3 (each associated with an interface device) and a capacitance C. The capacitance C represents distributed capacitance of the bus line and the total input capacitance of interface devices 111, 112 and 113. Data transfer rate depends on how fast the resistor R can charge the capacitance C. To increase the maximum data transfer rate, a bus line 101 can be separated into segments (e.g., 101A, 101B and 101C), each having a reduced capacitance, as shown in FIG. 1b. FIG. 1b also shows that bi-directional buffers 102 can be used to transfer data between these segments. Existing bi-directional buffers are often susceptible to latch-up when the buffers are in a low logic state. To attempt to combat such latch-up, some buffers have introduced an input offset. However, such an input offset increases the input-to-output offset, which is undesirable. Accordingly, there is still a need for new bi-directional buffers that overcome at least some, and preferably all, of the deficiencies of existing bi-directional buffers.

SUMMARY

Embodiments of the present invention are related to bi-directional buffers, and methods for providing bi-directional buffering. In accordance with an embodiment of the present invention, a bi-directional buffer includes a differential input/differential output amplifier that includes a first input/output node and a second/input output node. The differential input/differential output amplifier is configurable in a first configuration and a second configuration. When in the first configuration, the second input/output node follows the first input/output node. When in the second configuration, the first input/output node follows the second input/output node.

Further and alternative embodiments, and the features, aspects, and advantages of the embodiments of invention will become more apparent from the detailed description set forth below, the drawings and the claims.

BRIEF DESCRIPTION OF THE DRAWINGS

FIG. 2c shows some additional details of the bi-direction buffer of FIG. 1a, according to an embodiment of the present invention.

FIG. 3 illustrates the buffer of FIG. 2c configured such that node B follows node A.

FIG. 4 illustrates the buffer of FIG. 2c configured such that node A follows node B.

DETAILED DESCRIPTION

Figure 1A:
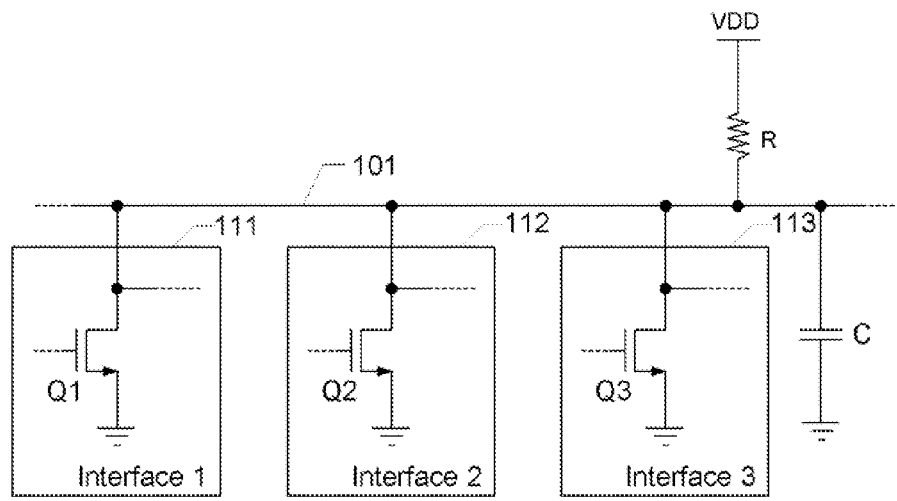
FIG. 1a illustrates an exemplary open-drain bus.
Figure 1B:
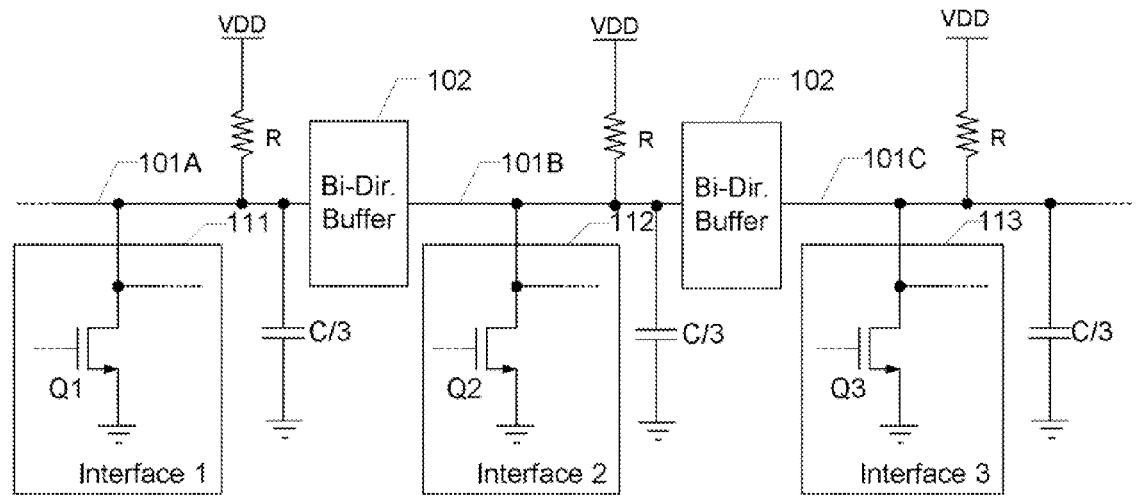
FIG. 1b illustrates how the exemplary open-drain bus of FIG. 1a can be separated into multiple segments.
Figure 2A:
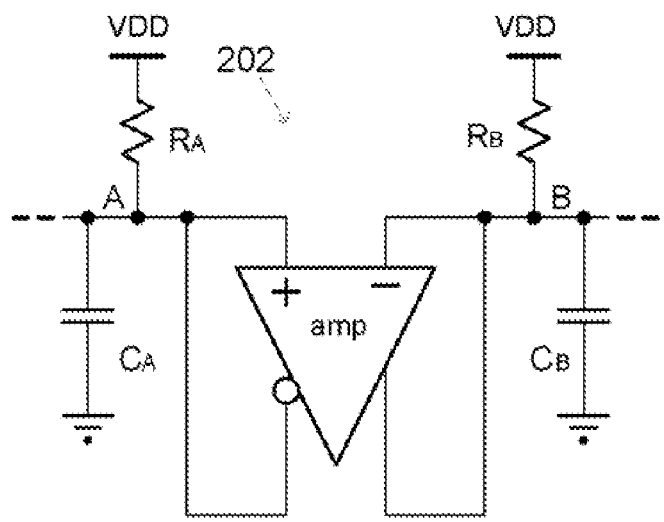
FIG. 2a illustrates a bi-direction buffer according to an embodiment of the present invention.

FIG. 2a illustrates a bi-direction buffer 202, according to an embodiment of the present invention. The buffer 202 is realized as a single differential input/differential output amplifier that changes its configuration depending on the direction of data flow. The differential input/differential output op-amp includes a first input/output node connected to a node A, and a second differential input/output node connected to a node B. Here nodes A and B represent bus line segments to be connected to the buffer 202. In other words, in this discussion, it is presumed that a bus line is divide into two segments, labeled A and B.

Resistors RA and RB are pull-up resistors that are external to the buffer 202. Capacitors CA and CB are illustrated to represent equivalent bus line capacitance and input capacitances of the interface devices associated with each bus line segment. The buffer 202 can be used, e.g., to interconnect two serial data line segments, or two clock line segments, but is not limited thereto. In FIGS. 2a-5c, the dashed lines connected to nodes A and B represent bus line segments A and B.

Figure 2B:
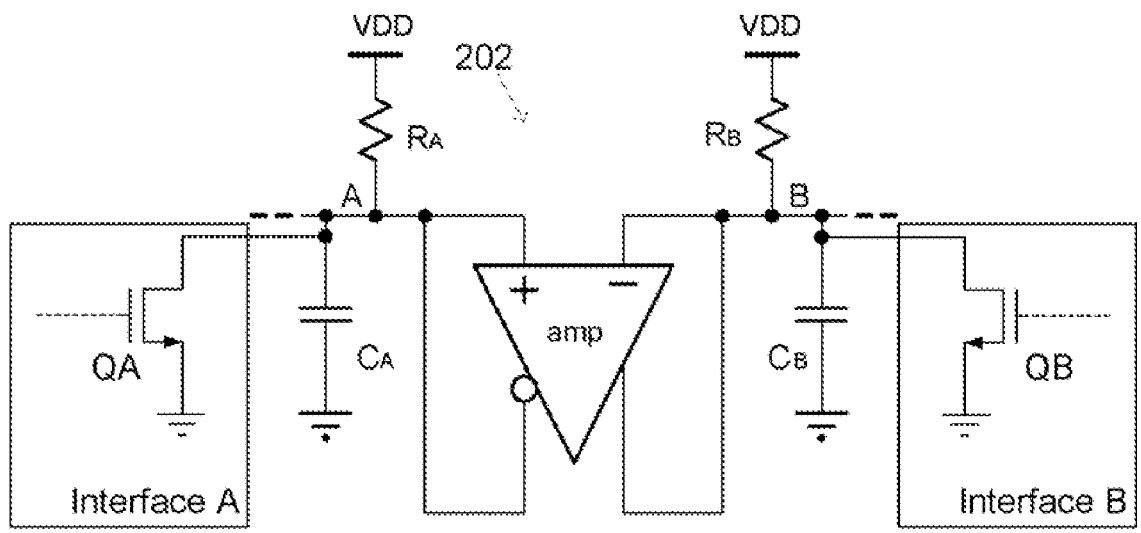
FIG. 2b illustrates the bi-directions buffer of FIG. 2a connected between two data bus line segments A and B.

FIG. 2b illustrates the bi-directions buffer 202 connected between two data bus line segments A and B and connecting two interface devices A and B. Open-drain transistor QA of interface device A is connected to the bus segment A. Pull-up resistor RA is connected between the bus segment A and a high voltage rail (VDD). Capacitor CA is connected between bus segment A and ground (GND). Similarly, open-drain transistor QB of interface device B is connected to the bus segment B. Pull-up resistor RB is connected between the bus segment B and VDD. Capacitor CB is connected between bus segment B and GND. Transistors QA and QB can alternatively be connected as open-collector devices, if transistors QA and QB are bipolar transistors (BJTs), instead of MOSFETs.

In one example, the bi-directional buffer 202 can be used to connect a printed circuit board (PCB) card (e.g., an I/O card) with a system backplane. For example, node A can represent a single data line (SDA) of a system backplane, and node B can be a SDA line of an I/O card. This is just an example, which is not meant to be limiting. Values of resistors RA and RB are selected to achieve an acceptable compromise between power dissipation and bus speed.

In accordance with specific embodiments of the present invention, when node A is brought down (e.g., by an external interface device), the bi-directional buffer 202 will bring down node B. Similarly, when node B is brought down, the bi-directional buffer 202 acts to bring down node A, thus providing bi-directional capability. Transitions from low to high are propagated in either direction in the same way. Bringing a node down refers to changing a node from a logic 1 state to a logic 0 state. Referring to FIG. 2b, node A can be brought down when interface device A turns on NMOS transistor QA. Similarly, node B can be brought down when interface device B turns on NMOS transistor QB.

FIG. 2c shows some additional details of the buffer 202, according to an embodiment of the present invention. Referring to FIG. 2c, the bi-directional buffer 202 is shown as including a pair of PMOS transistors Q1 and Q2 connected as a differential input pair, a tail current source I (which generates a current I), output stage NMOS transistors Q3 and Q4, and active load NMOS transistors Q5 and Q6 that form a current mirror along with NMOS transistor Q7. Transistors Q5 and Q6 may also be referred herein to as current sink transistors. The sources of transistors Q5, Q6 and Q7 are shown as being connected to ground. The gate of transistor Q1 provides the first input/output node of the differential input/differential output op-amp, and the gate of transistor Q2 provides the second input/output node of the differential input/differential output op-amp.

Transistors Q5, Q6 and Q7 form a current mirror having one input and two outputs. The common input of the current mirror is provided at the drain of transistor Q7, and the two outputs of the current mirror are provided at the drains of the active load transistors Q5 and Q6. In the Figs., each active load transistor Q5 and Q6 is shown as being set to sink current equal to 60% of the tail current I. Since the sum of the sink currents exceeds the available tail current I, only one load (transistor Q5 or Q6) will be active at a time. The other load (transistor Q5 or Q6) will collapse (since only 40% of tail current is available) and short the gate of one of the output devices (transistor Q3 or Q4). More generally, each active load transistor Q5 and Q6 is set to sink a current equal to P*I, where the coefficient P represents a portion or fraction of the tail current, and P>0.5. This will result in only one of the loads Q5 and Q6 being active at one time, while the other load collapses because it does not receive enough current. In the example discussed herein, P=0.6, but other values are within the scope of the present invention. For another example, P=0.7. There are many different types of current mirrors that can be used, other than the simple type illustrated. Such current mirrors will have one input and two outputs, where only one output is active at a time, while the other collapses. Use of such alternative current mirrors is also within the scope of the present invention.

The bi-directional buffer 202 operates as follows. Suppose initially both nodes A and B are high, i.e., have a HIGH voltage level, corresponding to a logic level 1. Exemplary HIGH voltage levels are +5V or +3.3V, but are not limited thereto. When nodes A and B are both high, both transistors Q1 and Q2 are turned off, as are transistors Q3 and Q4. Thus, nodes A and B are disconnected when nodes A and B are both high.

Now, suppose node A is brought down to a LOW voltage level, corresponding to a logic level 0, e.g., by an external interface device connected to node A. An exemplary LOW voltage level is ground (GND), but other levels, such as −3.3V or −5V are possible. When the voltage at the gate of transistor Q1 is low enough, the tail current source I becomes active and provides current to the differential pair of transistors Q1 and Q2. Since the voltage at the gate of transistor Q1 is lower than the voltage at the gate of transistor Q2, the drain current of transistor Q1 sets at a 60%*I level. This leaves only 40% of the current I available to transistors Q2 and Q6 (i.e., the drain current of transistor Q2 sets at a 40%*I level). As a result, transistor Q6 will be in triode mode (where its drain voltage is close to its source voltage), which will result in the shorting of the gate of transistor Q3 to ground (thus turning off transistor Q3), causing the bi-directional buffer 202 to attain the configuration shown in FIG. 3. Referring to FIG. 3, in this configuration the bi-directional buffer 202 will serve as a follower and will make node B follow node A.

Similarly, if node B is brought down (e.g., by an external interface device B), the bi-directional buffer 202 will re-configure itself to attain the configuration depicted in FIG. 4. This configuration results from transistor Q5 being put into triode mode, which results in the shorting of the gate of transistor Q4 to ground (thus turning off transistor Q4). Referring to FIG. 4, in this configuration the bi-directional buffer 202 will act as a follower and will make node A follow node B.

In the above described manner, the bi-directional buffer 202 facilitates bi-directional data transfer by re-configuring itself according to the direction of data flow. A benefit of the bi-directional buffer 202 is that it not susceptible to latch-up, since there is only one amplifier and only one feedback loop (of two possible feedback loops) active at a time.

In summary, the bi-direction buffer 202 has two configuration states, which depend on the data transfer direction, and may also depend on time constants. When node A is pulled down externally, the first configuration state (FIG. 3) is attained, and the buffer pulls down node B. When node B is pulled down externally, the second configuration state (FIG. 4) is attained, and buffer pulls node A down. Thus, bi-directional transfer of high-to-low transition occurs.

Bi-directional transfer of low-to-high transition occurs as follows. Suppose initially node A is pulled down by external interface device A so that the first configuration state (FIG. 3) results. When node A is released, two scenarios are possible. In the first scenario, where τA>τB, node B will tend to rise faster than node A, the voltage potential at the gate of transistor Q2 will be higher than at the gate of transistor Q1, the circuit will remain in the same configuration state, and the faster node B will follow the slower node A. The circuit will stay in the same configuration state (FIG. 3) until transistors Q1 and Q2 are conducting. When nodes A and B are high enough to turn off transistors Q1 and Q2, the nodes will continue to rise independently, each with its own time constant. In the second scenario, where τA<τB, node A will tend to rise faster than node B, causing the voltage potential at the gate of transistor Q1 to be higher than at the gate of transistor Q2, at which point the circuit will switch from the first configuration (FIG. 3) into the second configuration (FIG. 4). Now faster node A will follow slower node B. And again, when transistors Q1 and Q2 are turned off, the nodes will raise independently—each with its own time constant. Similar action takes place, when node B is pulled down and then released, thus achieving bi-directional transfer of low-to-high transition.

The bi-directional buffer 202 of FIG. 2c does not provide rail-to-rail operation, meaning nodes A and B are sometimes disconnected (i.e., when nodes A and B approach VDD). To accomplish rail-to-rail operation, if desired, the circuit of FIG. 2c can be modified accordingly to provide the bi-directional buffer 502 of FIG. 5a. More specifically, transistors Q8-Q16 can be added to the circuit of FIG. 2c, as shown in FIG. 5a, which results in nodes A and B always being connected to one another throughout rail-to-rail operation.

Figure 5A:
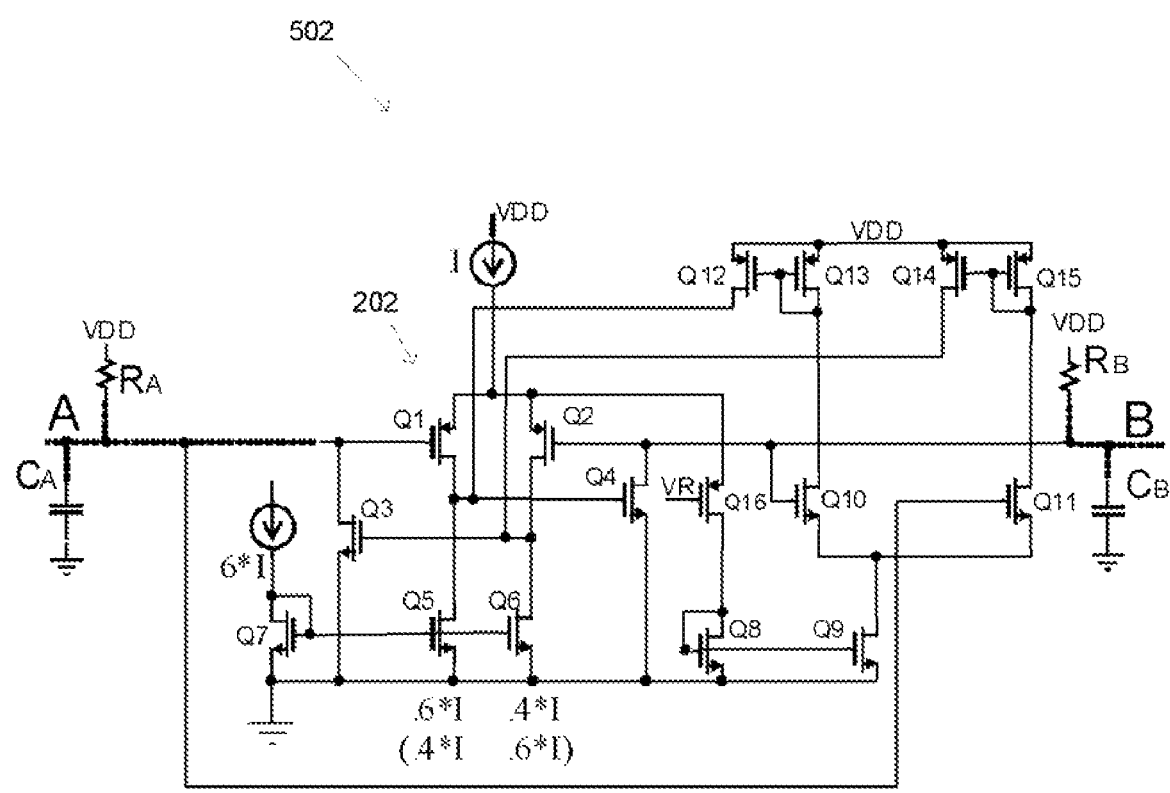
FIG. 5a illustrates a modification to the bi-direction buffer of FIG. 2a that enables rail-to-rail operation.

Referring to FIG. 5a, transistor Q16 serves as a current switch which diverts tail current from the PMOS differential pair Q1 and Q2 as their gate voltage potentials approach a reference voltage (VR) moving closer to VDD. This tail current feeds the differential pair of NMOS transistors Q10 and Q11 which provides essentially the same function as transistors Q1 and Q2 while operating at VA and VB close (or equal) to VDD, where VA is the voltage at node A, and VB is the voltage at node B.

Referring to FIG. 5a, the PMOS differential pair of transistors Q1 and Q2 will start to turn off when voltages VA and VB reach a voltage approximately equal to VR. Here, the added NMOS differential pair of transistors Q10 and Q11 will take over when transistors Q1 and Q2 turn off, and transistors Q10 and Q11 will operate all the way up to VDD.

The reference voltage VR is set somewhere between VDD and GND. Suppose initially nodes A and B are at GND, transistor Q16 is off and transistors Q1 and Q2 are on. If either of the nodes A or B is released the other node will follow it rising from GND to VDD (as described above). When nodes A and B rise high enough (approximately to VR), their common source connection potential rises as well, turning on transistor Q16. Transistor Q16 diverts part of tail current I into the differential amplifier including transistors Q10 and Q11. When nodes A and B rise sufficiently above VR, transistors Q1 and Q2 turn off and all of the tail current I is diverted to transistors Q10 and Q11. At this point, the differential amplifier including transistors Q10 and Q11 and the current mirror formed by transistors Q12-15 replaced the amplifier including transistors Q2 and Q1 and the current mirror formed by transistors Q5-Q7, preserving functionality.

Figure 5B:
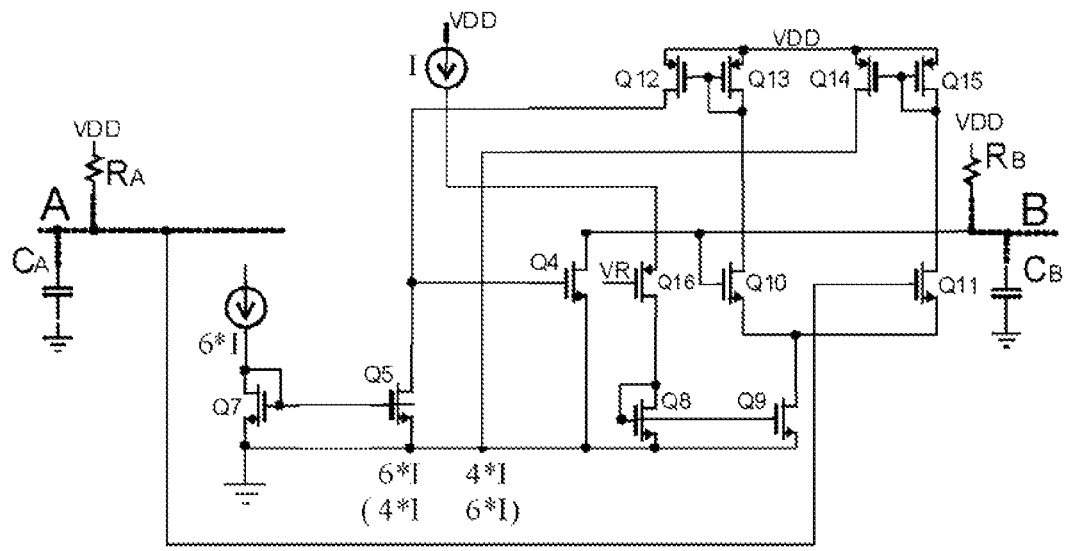
FIGS. 5b and 5C are used to explain how the circuit of FIG. 5a functions depending upon the magnitude of the voltage levels at nodes A and B.
Figure 5C:
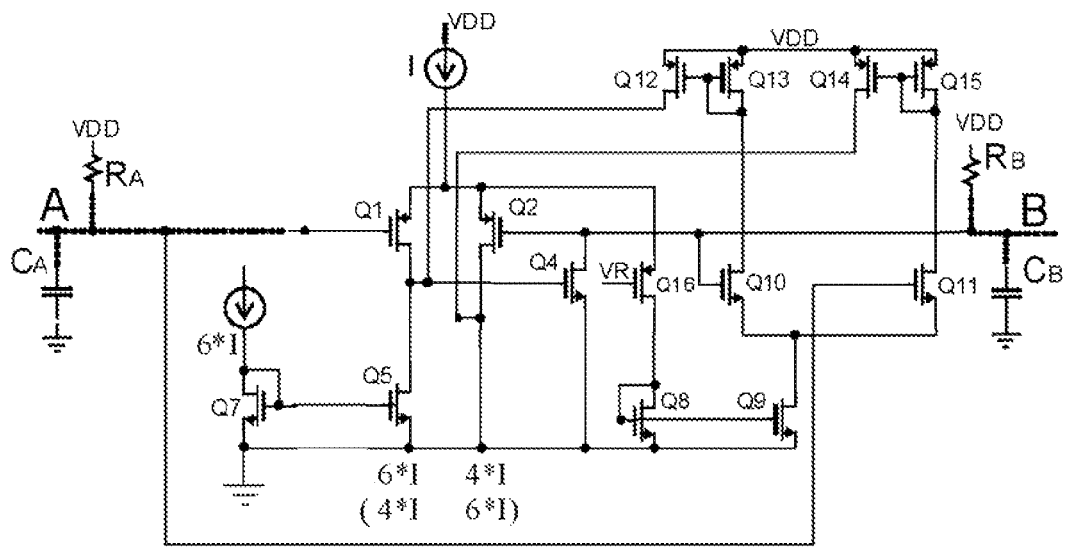

The bi-directional rail-to-rail buffer 502 can be explained in more detail with reference to FIGS. 5b and 5c, which are used to show possible configurations of the buffer 502 of FIG. 5a. Suppose that both nodes A and B are rising and the circuit attains state 1 (as discussed with reference to FIG. 3), i.e. node A is lower than node B, and node B follows node A. As the nodes rise, transistors Q1 and Q2 will turn off and transistor Q9 will supply tail current to the differential pair of transistors Q10 and Q11. Since node B is higher, transistor Q10 will get a larger portion of the tail current (as compared to transistor Q11). This portion of the current will be mirrored to the drain of transistor Q5. Thus, transistor Q5 will stay active, transistor Q6 will remain in triode mode and the circuit will attain the configuration of FIG. 5b. This configuration is equivalent to FIG. 3, as far as external nodes A and B are concerned. When voltages VA and VB are high enough to turn on transistor Q16, but not high enough to turn off transistors Q1 and Q2, the circuit will attain the configuration of FIG. 5c, which is also equivalent to FIG. 3 as far as external nodes A and B are concerned.

Figure 6:
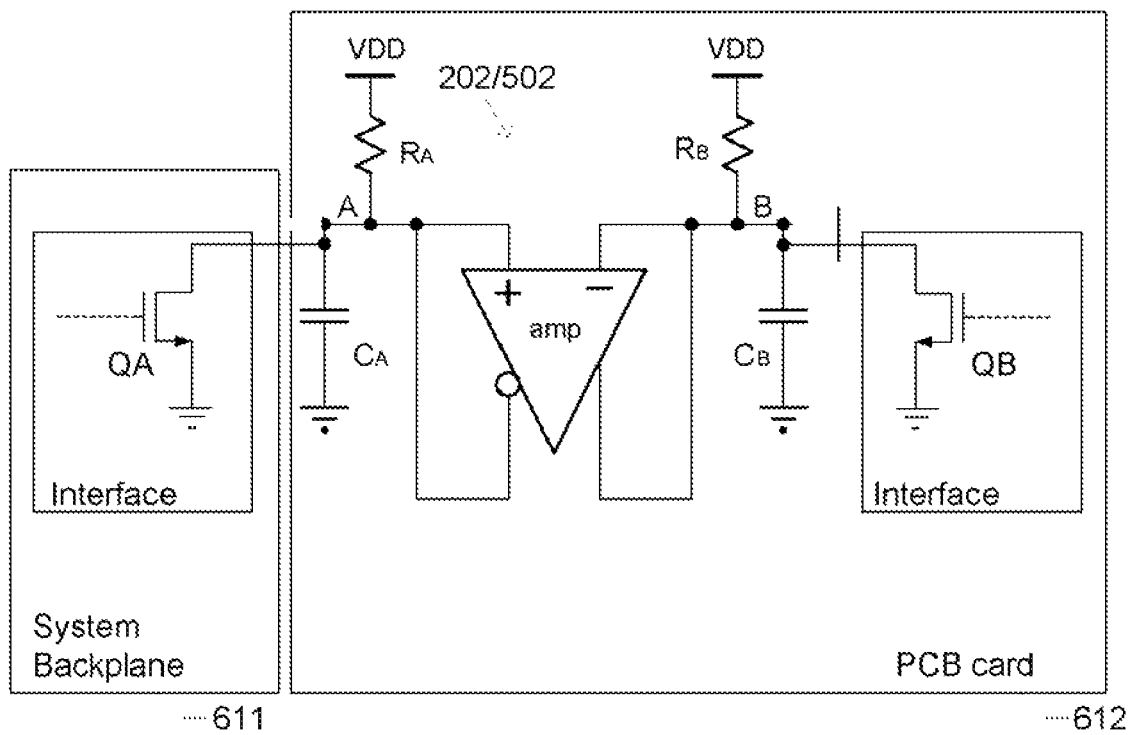
FIG. 6 illustrates a system including a bi-direction buffer of an embodiment of the present invention interconnecting two bus line segments, where an interface device of a PCB card is connected to one of the bus line segments and an interface device of a system backplane is connected to the other bus line segment.

The bi-direction buffers of embodiments of the present invention can be used to interconnect segments of bus lines. Exemplary types of buses in which embodiments of the present invention can be used include, e.g., I2C and SMBus, but are not limited thereto. Referring to FIG. 6, the buffers 202 and 502 of the present invention can be used, e.g., for interconnecting a PCB card 612 with a system backplane 611. In such a case, as shown in FIG. 6, the bi-directional buffer 202 or 502 can be built onto the PCB card 612. More generally, the buffers of the present invention can be used to interconnect devices that include open-drain or open-collector circuitry for driving a bus line.

In embodiments of the present invention described above, with reference to the Figs., circuits were shown as including MOS type transistors. However, in other embodiments the circuits need not be made from MOS devices, but can include other types of devices, such as BJTs or MES devices. For example, transistors Q1-Q15 can be BJT transistors.

Figure 7:
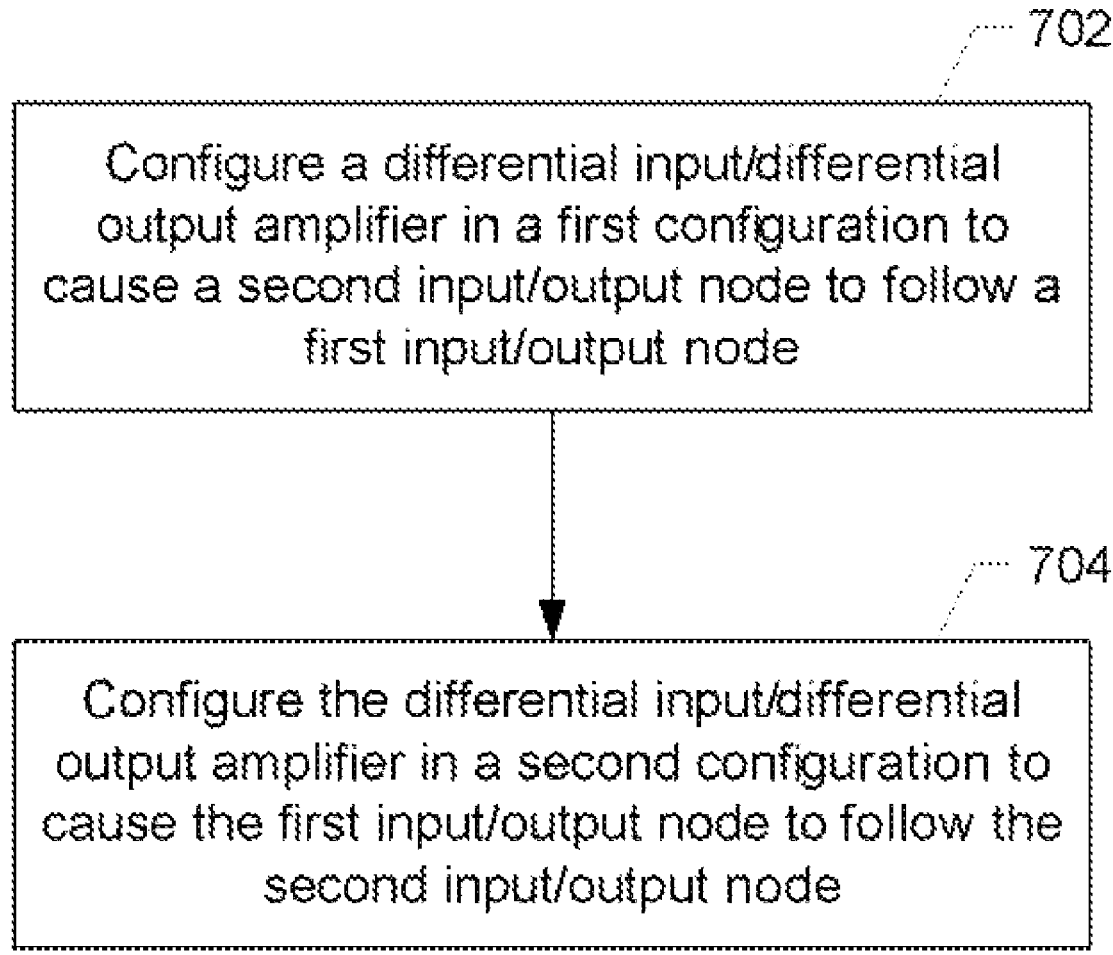
FIG. 7 is a high level flow diagram that is used to describe a method according to an embodiment of the present invention.

A method for bi-directional buffering, according to an embodiment of the present invention, shall now be described with reference to the high level flow diagram of FIG. 7. Referring to FIG. 7, at step 702, a differential input/differential output amplifier (e.g., 202 or 502) is configured in a first configuration to cause a second input/output node (e.g., node B in FIGS. 2a-6) to follow a first input/output node (e.g., node A in FIGS. 2a-6). At step 704, the differential input/differential output amplifier is configured in a second configuration to cause the first input/output node (e.g., node A in FIGS. 2a-6) to follow the second input/output node (e.g., node B in FIGS. 2a-6). For example, referring back to FIGS. 2c, 3 and 4, the bi-direction buffer 202 is configured in a first configuration in FIG. 3, and in a second configuration in FIG. 4.

Another way of viewing embodiments of the present invention is that a differential input amplifier includes first and second inputs (e.g., connected to nodes A and B respectively in FIGS. 2a-2c) and first and second outputs, yet only one of the first and second outputs is active at one time, with the other being inactive. The active output is connected to its corresponding input, and the inactive output is disconnected from its corresponding input, as can be appreciated from FIGS. 3 and 4. The second input follows the first input when the second output is active (e.g., as can be appreciated from FIG. 3). The first input follows the second input when the first output is active (e.g., as can be appreciated from FIG. 4).

While various embodiments of the present invention have been described above, it should be understood that they have been presented by way of example, and not limitation. It will be apparent to persons skilled in the relevant art that various changes in form and detail can be made therein without departing from the spirit and scope of the invention.

The breadth and scope of the present invention should not be limited by any of the above-described exemplary embodiments, but should be defined only in accordance with the following claims and their equivalents.

What is claimed is:

1. A bi-directional buffer, comprising:
  a differential input/differential output amplifier that includes a first input/output node; a second/input output node and a current mirror;
  wherein the differential input/differential output amplifier is configurable in a first configuration and a second configuration;
  wherein the current mirror includes an input, and first and second outputs;
  wherein the input of the current mirror receives a current from a current source that is capable of causing only one of the first and second outputs of the current mirror to be active at a time;
  wherein when the current source causes only the first output of the current mirror to be active, then the differential input/differential output amplifier is configured in the first configuration, which causes the second input/output node to follow the first input/output node; and
  wherein when the current source causes only the second output of the current mirror to be active, then the differential input/differential output amplifier is configured in the second configuration, which causes the first input/output node to follow the second input/output node.

2. The bi-directional buffer of claim 1, wherein:
  the differential input/differential output amplifier is configured in the first configuration when data flows from the first input/output node to the second input/output node; and
  the differential input/differential output amplifier is configured in the second configuration when data flows from the second input/output node to the first input/output node.

3. The bi-directional buffer of claim 1, wherein:
the differential input/differential output amplifier is configured in the first configuration when an external device provides a low logic level at the first input/output node; and
the differential input/differential output amplifier is configured in the second configuration when an external device provides a low logic level at the second input/output node.

4. A bi-directional buffer, comprising:
a differential input/differential output amplifier that includes a first input/output node and a second/input output node;
wherein the differential input/differential output amplifier is configurable in a first configuration and a second configuration;
wherein when in the first configuration, the second input/output node follows the first input/output node; and
wherein when in the second configuration, the first input/output node follows the second input/output node;
wherein the differential input/differential output amplifier comprises:
first and second p-channel transistors connected as a differential input pair;
third and fourth n-channel output stage transistors;
a current mirror including an input and first and second outputs;
wherein when a control terminal of the first transistor goes low, the second output of the current mirror collapses, which pulls the control terminal of the third transistor toward ground; and
wherein when a control terminal of the second transistor goes low, the first output of the current mirror collapses, which pulls the control terminal of the fourth transistor toward ground.

5. A bi-directional buffer, comprising:
a differential input/differential output amplifier that includes a first input/output node and a second/input output node;
wherein the differential input/differential output amplifier is configurable in a first configuration and a second configuration;
wherein when in the first configuration, the second input/output node follows the first input/output node; and
wherein when in the second configuration, the first input/output node follows the second input/output node;
wherein the differential input/differential output amplifier includes:
a first output stage transistor having a drain or collector connected to the first input/output node; and
a second output stage transistor having a drain or collector connected to the second/input output node;
wherein the first configuration is achieved by shorting a gate or base of the first output stage transistor to ground; and
wherein the second configuration is achieved by shorting a gate or base of the second output stage transistor to ground.

6. A bi-directional buffer, comprising:
a first transistor including a gate connected to the first input/output node, a source, and a drain;
a second transistor including a gate connected to the second input/output node, a source connected to the source of the first transistor, and a drain;
a first current source connected between a first voltage rail and the connected together sources of the first and second transistor;
a third transistor including a drain connected to the gate of the first transistor, a gate connected to the drain of the second transistor, and a source connected to ground;
a fourth transistor including a drain connected to the gate of the second transistor, a gate connected to the drain of the first transistor, and a source connected to ground;
a fifth transistor including a drain-source path connected between the drain of the first transistor and ground;
a sixth transistor including a drain-source path connected between the drain of the second transistor and ground, and including a gate connected to the gate of the fifth transistor;
a seventh transistor including a drain and gate connected together and to the gates of the fifth and sixth transistors, and including a source connected to ground; and
a second current source that provides a current, greater than half the current provided by the first current source, to the connected together drain and gate of the seventh transistor.

7. The bi-directional buffer of claim 6, wherein:
the fifth, sixth and seventh transistors form a current mirror;
the drain of the seventh transistor provides an input of the current mirror;
the drain of the fifth transistor provides a first output of the current mirror; and
the drain of the sixth transistor provides a second output of the current mirror.

8. The bi-directional buffer of claim 7, wherein:
the first transistor, the second transistor, the third transistor, the fourth transistor, the fifth transistor, the sixth transistor, the seventh transistor, the first current source and the second current source are all part of a differential input/differential output amplifier that includes a first input/output node and a second/input output node;
the differential input/differential output amplifier is configurable in a first configuration and a second configuration;
when the differential input/differential output amplifier is in the first configuration, the first output of the current mirror operates and the second output of the current mirror collapses, causing the gate of the third transistor to be pulled toward ground; and
when the differential input/differential output amplifier is in the second configuration, the first output of the current mirror collapses and the second output of the current mirror operates, causing the gate of the fourth transistor to be pulled toward ground.

9. The bi-directional buffer of claim 6, wherein:
the first and second transistors are PMOS transistors; and
the third, fourth, fifth, sixth and seventh transistors are NMOS transistors.

10. The bi-directional buffer of claim 6, wherein:
the first and second transistors are pnp transistors; and
the third, fourth, fifth, sixth and seventh transistors are npn transistors.

11. A system comprising:
a first bus line segment;
a second bus line segment;
a first pull-up resistor connected between the first bus line segment and a high voltage rail;
a second pull-up resistor connected between the second bus line segment and the high voltage rail; and
a bi-directional buffer, connected between the first and second bus line segments, the bi-direction buffer comprising a differential input/differential output amplifier that includes a first input/output node, a second/input output node and a current mirror, first input/output node connected to the first bus line segment, the second input/output node connected to the second bus line segment;

wherein the differential input/differential output amplifier is configurable in a first configuration and a second configuration;

wherein the current mirror includes an input, and first and second outputs;

wherein the input of the current mirror receives a current from a current source that is capable of causing only one of the first and second outputs of the current mirror to be active at a time;

wherein when the current source causes only the first output of the current mirror to be active, then the differential input/differential output amplifier is in the first configuration, which causes the second input/output node to follow the first input/output node; and wherein when the current source causes only the second output of the current mirror to be active, then the differential input/differential output amplifier is in the second configuration, which causes the first input/output node to follow the second input/output node.

12. The system of claim 11, further comprising:

a first interface device including an open-drain or open-collector transistor connected to the first bus line segment; and a second interface device including an open-drain or open-collector transistor connected to the second bus line segment.

13. The system of claim 12, wherein:

the differential input/differential output amplifier is configured in the first configuration when the first interface device pulls the first bus line segment low; and the differential input/differential output amplifier is configured in the second configuration when the second interface device pulls the second bus line segment low.

14. The system of claim 13, wherein:

the first interface device comprises a system backplane; and the second interface device comprises a printed circuit board (PCB) card.

15. A bi-directional buffer, comprising:

first and second p-channel transistors connected as a differential input pair, wherein a control terminal of the first p-channel transistor is a first input/output node of the bi-direction buffer, and a control terminal of the second p-channel transistor is a second input/output node of the bi-direction buffer;

third and fourth n-channel output stage transistors;

a current mirror including an input and first and second outputs;

wherein when the first input/output node goes low, the second output of the current mirror collapses, which pulls a control terminal of the third transistor toward ground, resulting in the second input/output node following the first input/output node; and wherein when the second input/output node goes low, the first output of the current mirror collapses, which pulls a control terminal of the fourth transistor toward ground, resulting in the first input/output node following the second input/output node.

16. The bi-direction buffer of claim 15, wherein:

the third n-channel output stage transistor includes a drain-source or collector-emitter current path connected between the first input-output node and a low voltage rail; and the fourth n-channel output stage transistor includes a drain-source or collector-emitter current path connected between the second input-output node and the low voltage rail.

17. The bi-direction buffer of claim 16, wherein:

the first and second p-channel transistors are PMOS transistors, and their control terminals are gates; and the third and forth n-channel transistors are NMOS transistors, and their control terminals are gates.

18. The bi-direction buffer of claim 16, wherein:

the first and second p-channel transistors are pnp transistors, and their control terminals are bases; and the third and forth n-channel transistors are npn transistors, and their control terminals are bases.

19. A method for bi-directional buffering using a differential input/differential output amplifier that includes a first input/output node, a second/input output node, a first output stage transistor having a drain or collector connected to the first input/output node, and a second output stage transistor having a drain or collector connected to the second/input output node, the method, comprising:

(a) configuring the differential input/differential output amplifier in a first configuration, by shorting a gate or base of the first output stage transistor to ground, to cause a second input/output node to follow a first input/output node; and (b) configuring the differential input/differential output amplifier in a second configuration, by shorting a gate or base of the second output stage transistor to ground, to cause the first input/output node to follow the second input/output node.

20. A bi-directional buffer, comprising:

a differential input amplifier having first and second inputs and first and second outputs;

wherein only one of the first and second outputs is active at one time, with the other being inactive;

wherein the active output is connected to its corresponding input, and the inactive output is disconnected from its corresponding input;

wherein the second input follows the first input when the second output is active; and wherein the first input follows the second input when the first output is active.

21. The bi-direction buffer of claim 1, wherein:

the differential input/differential output amplifier comprises first and second output stage transistors (Q3 and Q4);

when the differential input/differential output amplifier is in the first configuration, the second output stage transistor (Q4) is turned on and the first output stage transistor (Q3) is turned off; and when the differential input/differential output amplifier is in the second configuration, the second output stage transistor (Q4) is turned off and the first output stage transistor (Q3) is turned on.

22. A bi-directional buffer, comprising:

a differential input/differential output amplifier that includes a first input/output node and a second/input output node;

wherein the differential input/differential output amplifier is configurable in a first configuration and a second configuration;

wherein the differential input/differential output amplifier also comprises first and second output stage transistors (Q3 and Q4), and first and second load transistors (Q5 and Q6);

wherein when the differential input/differential output amplifier is in the first configuration,
- the second output stage transistor (Q4) is turned on and the first output stage transistor (Q3) is turned off;
- the first load transistor (Q5) provides a bias voltage to a control terminal of the second output stage transistor (Q4) that causes the second output stage transistor (Q4) to be turned on;
- the second load transistor (Q6) provides a bias voltage to a control terminal of the first output stage transistor (Q3) that causes the first output stage transistor (Q3) to be turned off; and
- the second input/output node follows the first input/output node;

and wherein when the differential input/differential output amplifier is in the second configuration,
- the second output stage transistor (Q4) is turned off and the first output stage transistor (Q3) is turned on;
- the first load transistor (Q5) provides a bias voltage to a control terminal of the second output stage transistor (Q4) that causes the second output stage transistor (Q4) to be turned off;
- the second load transistor (Q6) provides a bias voltage to a control terminal of the first output stage transistor (Q3) that causes the first output stage transistor (Q3) to be turned on; and
- the first input/output node follows the second input/output node.

23. The bi-directional buffer of claim 1, wherein:
when the differential input/differential output amplifier is in the first configuration, a first transistor of the differential input/differential output amplifier is turned on, and a second transistor of the differential input/differential output amplifier is turned off; and
when the differential input/differential output amplifier is in the second configuration, the first transistor of the differential input/differential output amplifier is turned off, and a second transistor of the differential input/differential output amplifier is turned on.

24. The bi-directional buffer of claim 1, wherein:
the differential input/differential output amplifier includes at least two transistors that are turned on or turned off, depending on whether the differential input/differential output amplifier is in the first configuration or the second configuration; and
which of the at least two transistors is turned on and which of the at least two transistor is turned off, is different when the differential input/differential output amplifier is in the first configuration as compared to when differential input/differential output amplifier is in the second configuration.

25. The bi-directional buffer of claim 8, wherein:
when the differential input/differential output amplifier is in the first configuration, the second input/output node follows the first input/output node; and
when the differential input/differential output amplifier is in the second configuration, the first input/output node follows the second input/output node.

26. The method of claim 19, wherein:
the differential input/differential output amplifier includes at least two transistors that are turned on or turned off, depending on whether the differential input/differential output amplifier is in the first configuration or the second configuration; and
which of the at least two transistors is turned on and which of the at least two transistor is turned off, is different when the differential input/differential output amplifier is configured to be in the first configuration at step (a) as compared to when differential input/differential output amplifier is configured to be in the second configuration at step (b).

27. The system of claim 11, fun her comprising:
a first capacitance between the first bus line segment and a low voltage rail; and
a second capacitance between the second bus line segment and the low voltage rail.

* * * * *

UNITED STATES PATENT AND TRADEMARK OFFICE
CERTIFICATE OF CORRECTION

PATENT NO. : 7,737,727 B2  Page 1 of 1
APPLICATION NO. : 12/060829
DATED : June 15, 2010
INVENTOR(S) : Anatoly Aranovsky It is certified that error appears in the above-identified patent and that said Letters Patent is hereby corrected as shown below:

In Claim 1, at Column 6, Line 38, replace "node; a second/input output" with --node, a second input/output--;

In Claim 27, at Column 12, line 36, replace "fun her" with --further--.

Signed and Sealed this

Twenty-fourth Day of August, 2010

David J. Kappos
*Director of the United States Patent and Trademark Office*